(12) United States Patent
Chou et al.

(10) Patent No.: US 6,934,143 B2
(45) Date of Patent: Aug. 23, 2005

(54) METAL-INSULATOR-METAL CAPACITOR STRUCTURE

(75) Inventors: You-Hua Chou, Taipei (TW);
Yen-Shuo Su, Jhubei (TW);
Yen-Chang Chao, Taichung (TW);
Jain-Shing Tsai, Da-an, Taichung (TW); Yong-Ping Chan, Hsin-Tien (TW); Jung-Chen Yang, Jhubei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/678,236

(22) Filed: Oct. 3, 2003

(65) Prior Publication Data

US 2005/0073800 A1 Apr. 7, 2005

(51) Int. Cl.$^7$ ............................ H01G 4/005; H01G 4/06
(52) U.S. Cl. ...................... 361/303; 361/311; 29/25.42
(58) Field of Search ...................... 361/301.4, 303–305, 361/306.1, 311–313; 257/301, 306, 303; 29/25.42

(56) References Cited

U.S. PATENT DOCUMENTS

| | | | |
|---|---|---|---|
| 3,579,811 A | 5/1971 | Matsuo | |
| 3,579,813 A | 5/1971 | Tomiwa | |
| 3,753,051 A | 8/1973 | Willy | |
| 4,959,705 A | 9/1990 | Lemnios et al. | |
| 5,450,279 A | 9/1995 | Yoshida et al. | |
| 5,559,667 A | 9/1996 | Evans | |
| 5,583,359 A | * 12/1996 | Ng et al. ..................... | 257/306 |
| 6,184,551 B1 | 2/2001 | Lee et al. | |
| 6,198,617 B1 | 3/2001 | Sun | |
| 6,252,760 B1 | 6/2001 | Sen | |
| 6,285,050 B1 | 9/2001 | Emma et al. | |
| 6,307,730 B1 | 10/2001 | Yamanishi | |
| 6,346,127 B1 | 2/2002 | Kuriyama | |
| 6,366,443 B1 | 4/2002 | Devoe et al. | |
| 6,391,707 B1 | 5/2002 | Dirnecker et al. | |
| 6,392,869 B2 | 5/2002 | Shiraishi et al. | |
| 6,417,535 B1 | 7/2002 | Johnson et al. | |
| 6,451,667 B1 | 9/2002 | Ning | |
| 6,462,931 B1 | 10/2002 | Tang et al. | |
| 6,504,202 B1 | 1/2003 | Allman et al. | |
| 6,542,352 B1 | 4/2003 | Devoe et al. | |
| 2001/0020713 A1 | 9/2001 | Yoshitomi et al. | |
| 2001/0050409 A1 | 12/2001 | Kasahara | |
| 2002/0036312 A1 | 3/2002 | Bertagnolli et al. | |
| 2002/0093780 A1 | 7/2002 | Hajimiri et al. | |
| 2002/0113292 A1 | 8/2002 | Appel | |
| 2002/0153554 A1 | 10/2002 | Kajita et al. | |
| 2002/0163029 A1 | 11/2002 | Dimecker et al. | |
| 2003/0003665 A1 | 1/2003 | Nakagawa | |
| 2004/0036143 A1 | * 2/2004 | Hu et al. ..................... | 257/534 |

* cited by examiner

*Primary Examiner*—Eric W. Thomas
(74) *Attorney, Agent, or Firm*—Duane Morris LLP

(57) ABSTRACT

A capacitor having an electrically/conductive plate, an electrically conductive segmented electrically conductive plate segments and a second plurality of electrically conductive plate segments, a first capacitor dielectric disposed between the plate and the segment plate, at least one electrically conductive interconnect coupling each of the plate segment of one of the first and second plurality of plate segments to the plate, and a second capacitor dieletric disposed between the plate segments.

20 Claims, 10 Drawing Sheets

US 6,934,143 B2

METAL-INSULATOR-METAL CAPACITOR STRUCTURE

FIELD OF THE INVENTION

The present invention relates to integrated circuit and semiconductors and, more particularly, to a metal-insulator-metal capacitor structure having an increased capacitor volume without occupying extra die area, and a capacitor dielectric material of a high dielectric constant.

BACKGROUND OF THE INVENTION

Advances in integrated circuit (IC) technology have involved the fabrication of multiple layers of interconnects. Interconnects are formed on top of the substrate and connect various functional components of the substrate and other electrical connections to the IC.

Capacitors are incorporated between the interconnect layers in order to maximize the use of the space between the interconnect layers. The capacitors formed between the interconnect layers are preferably of a metal-insulator-metal (MIM) construction, as the conductors of the interconnect layers are metal in construction. MIM capacitors may be used to store a charge in a variety of semiconductor devices, that may be utilized in the IC.

Conventional MIM capacitor structures consume a relatively large percentage of the surface area of a semiconductor wafer or chip because they are typically constructed as a large flat structure formed by a low dielectric constant (k) silicon dioxide or nitride capacitor dielectric layer sandwiched between upper and lower metal electrodes, positioned parallel to the wafer surface. In order to reduce the area of these structures, the prior art has attempted to replace the low k material used for the capacitor dielectric layer with high k materials such as $BaTiO_3$ and $SiTiO_3$. However, such high k materials do not adhere well to the metal electrodes, which are still relatively large, thereby leading to delaminations in the capacitor structures. Hence, the capacitor dielectric in conventional MIM capacitor structures is limited to dielectric materials with high dielectric constants, such as $BaTiO_3$ and $SiTiO_3$.

Accordingly, a MIM capacitor structure is needed that utilizes wafer area more efficiently than conventional MIM capacitor structures and allows the use of capacitor dielectrics with high dielectric constants.

SUMMARY OF THE INVENTION

According to a first aspect of the invention, a capacitor comprising an electrically conductive plate, an electrically conductive segmented plate defining at least two electrically conductive plate segments, a first capacitor dielectric disposed between the plate and the segmented plate, at least one electrically conductive interconnect coupling one of the at least two plate segments to the plate, and a second capacitor dielectric disposed between the at least two plate segments.

According to a further aspect of the invention, a capacitor comprising an electrically conductive plate, an electrically conductive segmented plate defining a first plurality of electrically conductive plate segments and a second plurality of electrically conductive plate segments, a first capacitor dielectric disposed between the plate and the segmented plate, at least one electrically conductive interconnect coupling each of the plate segments of one of the first and second plurality of plate segments to the plate, and a second capacitor dielectric disposed between the plate segments.

According to another aspect of the invention, a method of fabricating a capacitor, comprising forming an electrically conductive plate, forming a first capacitor dielectric over the plate, forming at least one via in the first capacitor dielectric, forming an electrically conductive segmented plate over the first capacitor dielectric, the segmented plate defining at least two electrically conductive plate segments, the at least one via electrically coupling one of the at least two plate segments to the plate, and forming a second capacitor dielectric between the at least two plate segments.

According to still another aspect of the invention, a method of fabricating a capacitor, comprising forming an electrically conductive plate, forming a first capacitor dielectric over the plate, forming a plurality of vias in the first capacitor dielectric, forming an electrically conductive segmented plate over the first capacitor dielectric, the segmented plate defining a first plurality of electrically conductive plate segments and a second plurality of electrically conductive plate segments, the vias electrically coupling the conductive plate segments of one of the first and second plurality of plate segments to the plate, and forming a second capacitor dielectric between the plate segments.

DETAILED DESCRIPTION OF THE INVENTION

The invention is a metal-insulator-metal (MNM) capacitor structure and fabrication method. The MIM capacitor structure of the invention has increased capacitor volume without occupying extra die area, and allows the use of a capacitor dielectric material of a high dielectric constant, such as $BaTiO_3$, which can have a dielectric constant of up to 11 at room temperature.

Figure 1A:
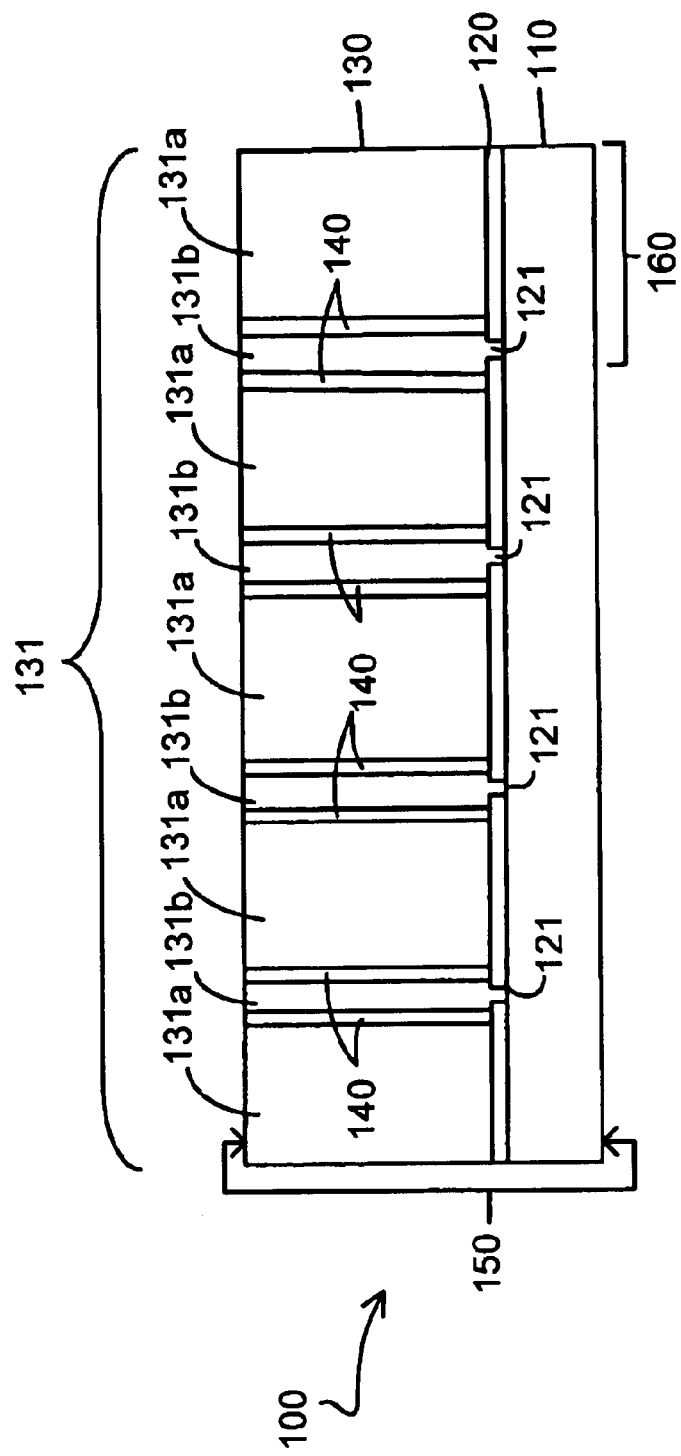
FIG. 1A is an elevational view of an illustrative embodiment of a MIM capacitor structure of the present invention.
Figure 1B:
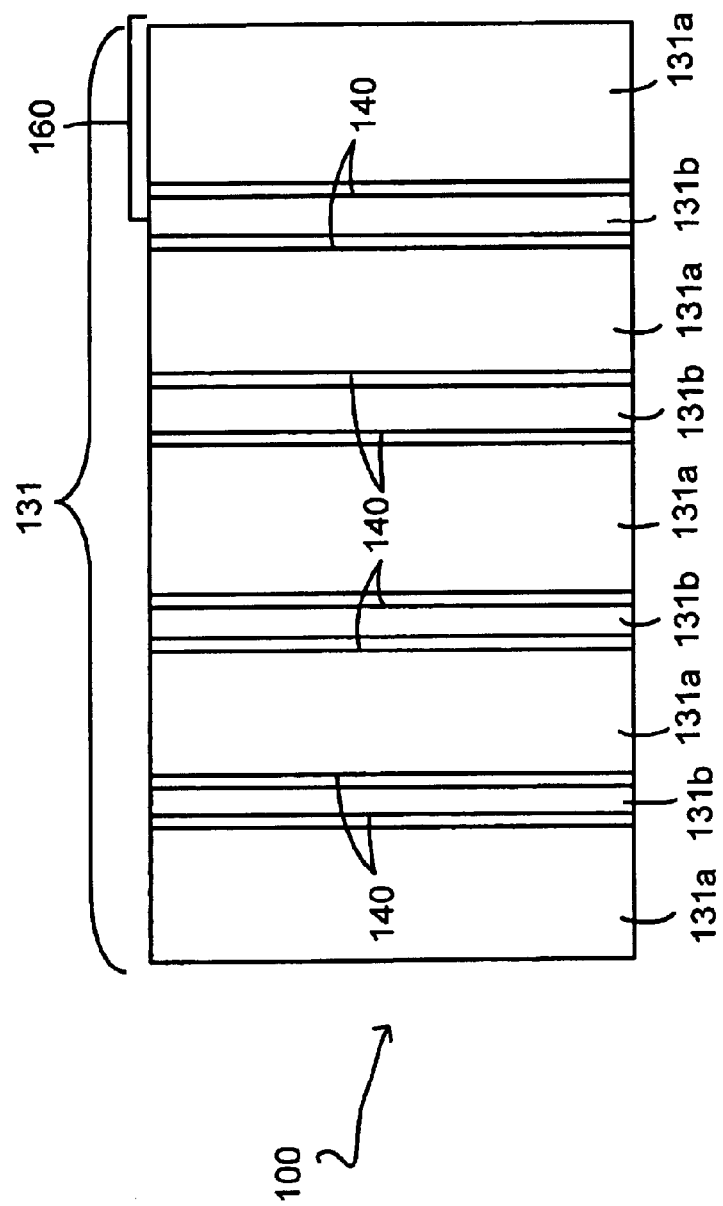
FIG. 1B is a top plan view of the MIM capacitor structure of the present invention.

FIGS. 1A and 1B shown an illustrative embodiment of the MIM capacitor structure of the present invention. The capacitor structure, denoted by numeral 100, includes a solid continuous metal plate 110, a segmented metal plate 130 of spaced apart metal plate segments 131, a capacitor dielectric 120 disposed between the continuous metal plate 110 and the segmented metal plate 130, and a capacitor dielectric 140 disposed between the metal plate segments 131 of the segmented metal plate 130. The metal plate segments 131 may be formed as alternating thick (T1 in FIG. 1A) and thin (T2 in FIG. 1A) metal plate sections 131a and 131b. Every other metal plate segment 131 (the thin metal plate segments 131b in the shown embodiment) of the metal segmented plate 130 is electrically coupled to the continuous metal plate 110 by at least one electrically conductive interconnect 121, or row of electrically conductive interconnects (not visible), which extend through the capacitor dielectric 120. The continuous metal plate 110 and interconnect-coupled metal plate segments 131 (the thin metal plate segments 131b in the shown embodiment) of the segmented metal plate 130 form one capacitor electrode of the capacitor structure, and the other metal plate segments 131 (the thick plate segments 131a in the shown embodiment) of the segmented metal plate 130 form the other capacitor electrode of the capacitor structure.

As oriented in FIG. 1A, the continuous metal plate 110 and the metal plate segments 131 of the segmented metal plate 130, not associated with the interconnects 121 (the thick metal plate segments 131a in the shown embodiment), form a plurality of "vertical" capacitors 150. The metal plate segments 131 of the segmented metal plate 130, not associated with the interconnects 121 (the thick metal plate segments 131a in the shown embodiment), and the interconnect-coupled metal plate segments 131 (the thin metal plate segments 131b in the shown embodiment) of the segmented metal plate 130 form a plurality of "horizontal" or "lateral" capacitors 160. The vertical and lateral capacitors 150 and 160 may be coupled together in parallel to increase the capacitance of the overall MIM capacitor structure 100.

The segmented metal plate 130 maximizes the electrode area of this plate and allows the space between the segments 131a and 131b to be filled with high dielectric constant (K) materials. The side walls of the plate segments 131a and 131b effectively increase the total capacitor area, and the high K materials disposed between the plate segments 131a and 131b increases the capacitor volume.

The MIM capacitor structure of the invention may be incorporated in an integrated circuit (IC) (not shown) of the type having multiple metallization layers for interconnections. The interconnections may be built or layered above one another and may overlie a substrate (not shown) that serves as the foundation for the IC and its functional components such as transistors and other semiconductor devices.

Figure 2:
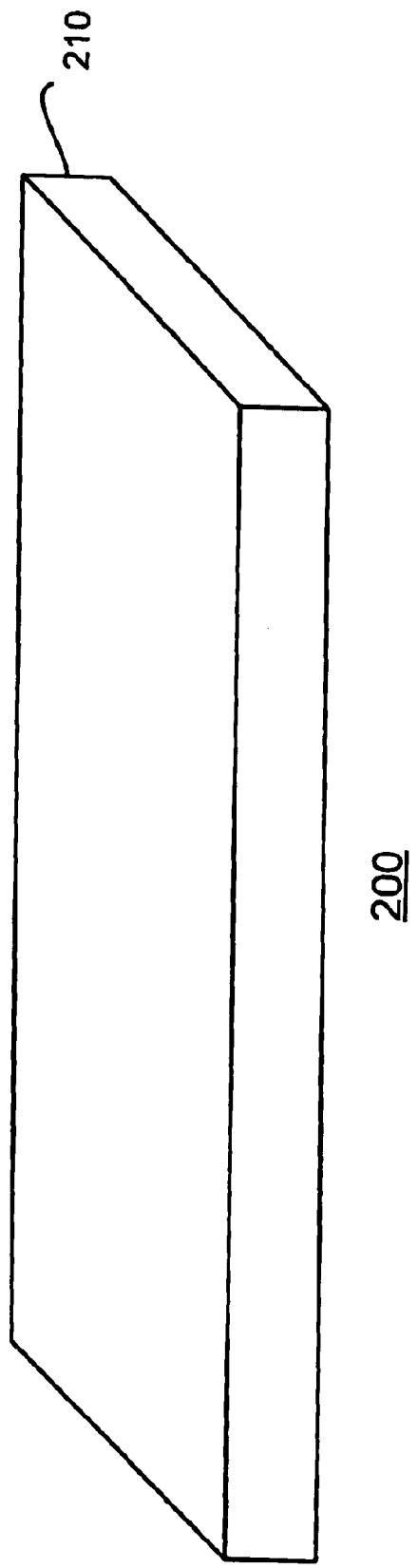
FIGS. 2–8 are perspective views depicting a method for fabricating a MIM capacitor structure according to an illustrative embodiment of the present invention.

A method for fabricating the above MIM capacitor structure according to an illustrative embodiment of the present invention will now be described with reference to the perspective views of FIGS. 2–8 and the flow chart of FIG. 9. Referring initially to step 300 of FIG. 9, a first metal layer 210 is deposited over a substrate 200 as shown in FIG. 2. The substrate 200 may be an inter-metal dielectric layer, which has been patterned with contact vias or damascene metal lines, depending upon the IC technology used. The first metal layer 210 may be formed The first metal layer 210 forms the solid continuous metal plate 110 of the MIM capacitor structure shown in FIG. 1A. The substrate 200 may comprise a semiconductor material, such as silicon, and may be covered by an insulating layer (not shown). The substrate 200 may also include circuits, transistors, and other semiconductor devices (not shown). The first metal layer 210 may comprise one or more layers of metal, such as Ti—TiN—AlCu—TiN or Ti—TaN—Cu, depending upon the integrated circuit technology used. The metal layer 210 may be deposited by processes including, without limitation, PVD (physical vapor deposition), CVD metal or plating. The first metal layer 210 may be deposited to a thickness of approximately 200 to 500 angstroms.

Figure 3:
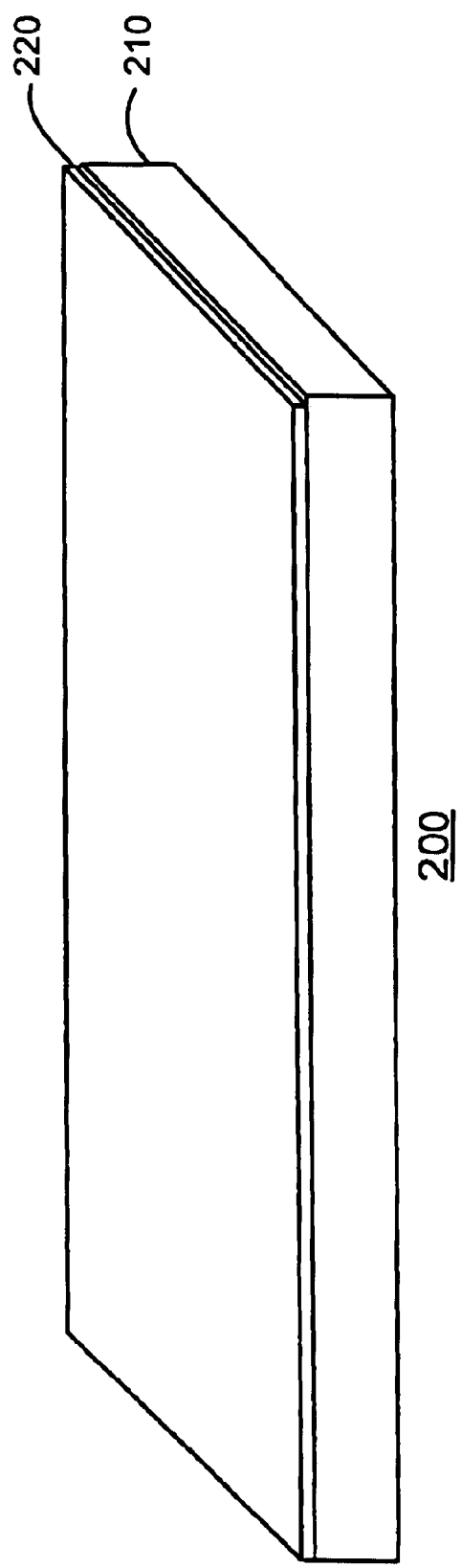
Figure 9:
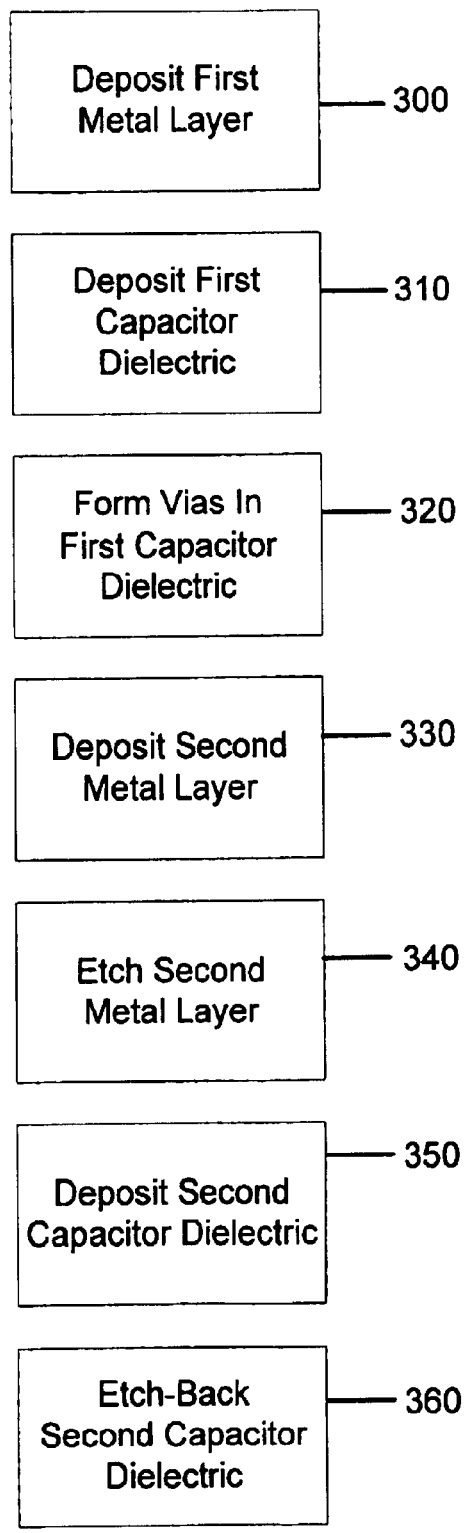
FIG. 9 is a flow chart for the method of the invention.

In step 310 of FIG. 9, a layer 220 of a first capacitor dielectric is deposited over the first metal layer 210 as shown in FIG. 3. The capacitor dielectric layer 220 forms the capacitor dielectric 120 between the continuous metal plate 120 and the segmented metal plate 130 of the MIM capacitor structure shown in FIGS. 1A and 1B. The capacitor dielectric layer 220 may comprise one or more layers of silicon oxide, silicon nitride, plasma enhanced nitride (pe nitride) and oxy nitride or various combinations thereof, deposited, for example, using PVD sputtering. The capacitor dielectric layer 220 may be a relatively thin layer approximately 50 to 500 angstroms, depending upon the capacitance desired and the dielectric material or materials used.

Figure 4:
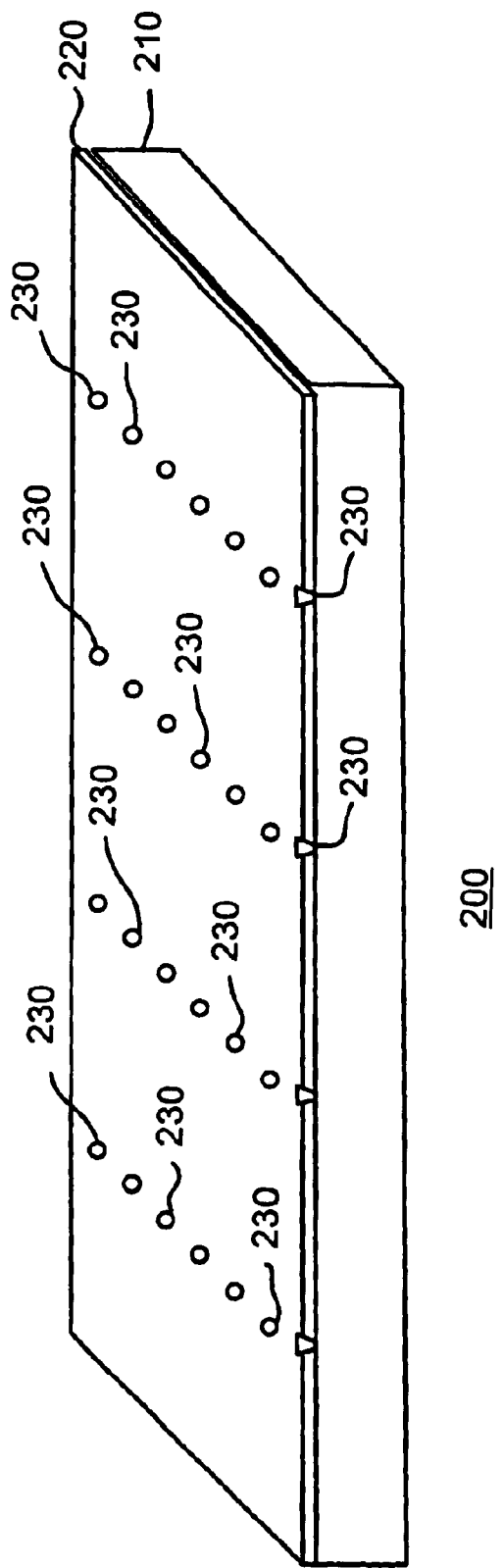

In step 320 of FIG. 9, one or more rows of at least one via 230 are formed in the capacitor dielectric layer 220 as shown in FIG. 4. The vias 230 may be formed using a conventional via plasma etch process. The first metal layer 210 can be used as an etch stop for the via etch process.

Figure 5:
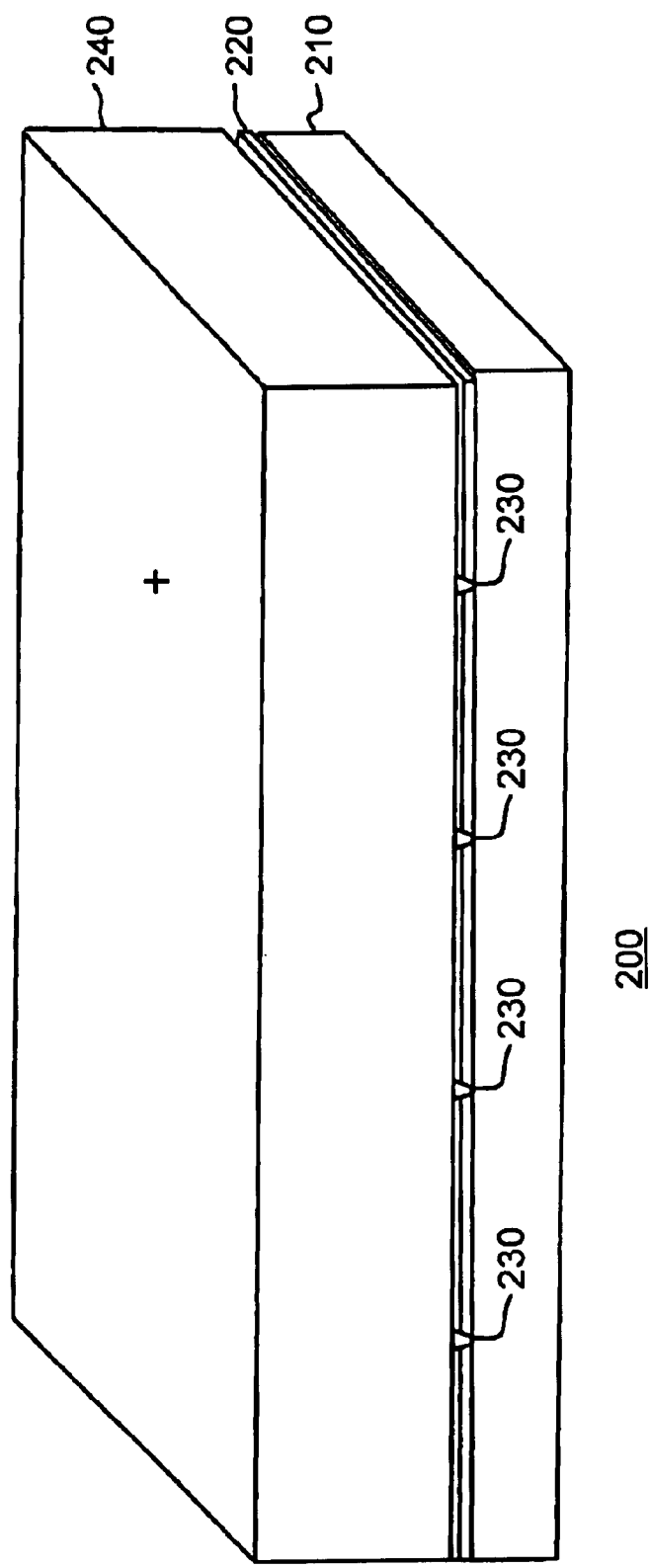

In step 330 of FIG. 9, a second metal layer 240 may be deposited over the capacitor dielectric layer 220 as shown in FIG. 5. The second metal layer 240 conformally fills the vias 230. The metal filled vias 230 form the electrical interconnects 121 of the MIM capacitor structure shown in FIGS. 1A and 1B. The vias may also be filled with a metal or other electrically conductive material in a separate fabrication step, prior to the deposition of the second metal layer 240, if desired. The second metal layer 240 may comprise one or more layers of metal such as Ti—TiN—AlCu—TiN or Ti—TaN—Cu, depending upon the integrated circuit technology used. The second metal layer 240 may be deposited by processes including, without limitation, PVD (physical vapor deposition), CVD metal or plating. The second metal layer 240 is typically thicker than the first metal layer 210 at approximately 500 to 8,000 angstroms to increase the vertical area of the metal plate segments that will be formed therefrom.

Figure 6:
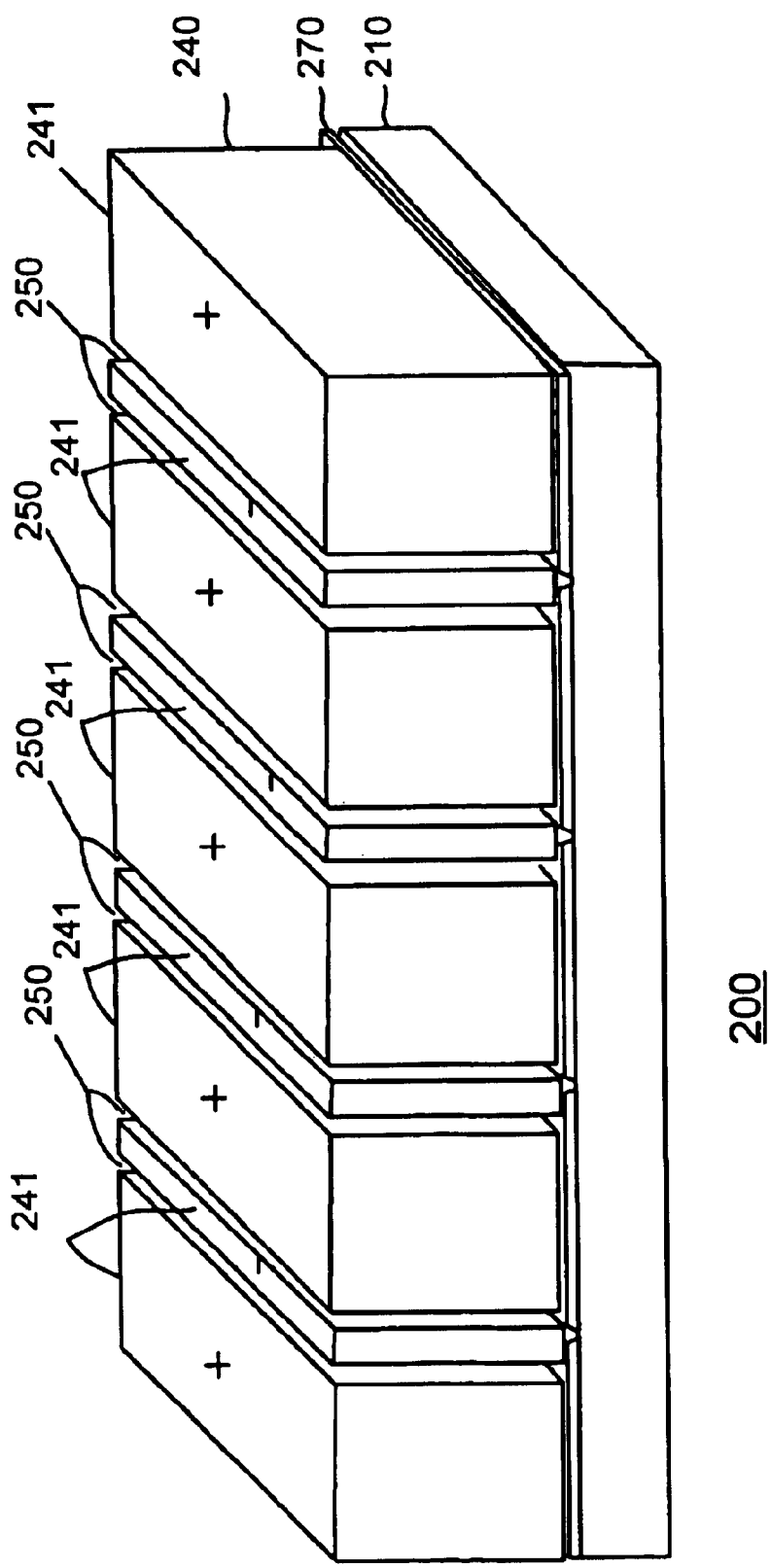

In step 340 of FIG. 9, the second metal layer 240 is etched to form metal segments 241 as shown in FIG. 6. The etched second metal layer 240 forms the segmented plate 130 of the MIM capacitor structure shown in FIGS. 1A and 1B. Etching can be accomplished using conventional photolithographic and metal etching processes, such as reactive ion etching. The capacitor dielectric layer 220 functions as an etch stop layer for this process. The spaces 250 formed between the segments 241 are typically about 50 to 450 in thickness.

Figure 7:
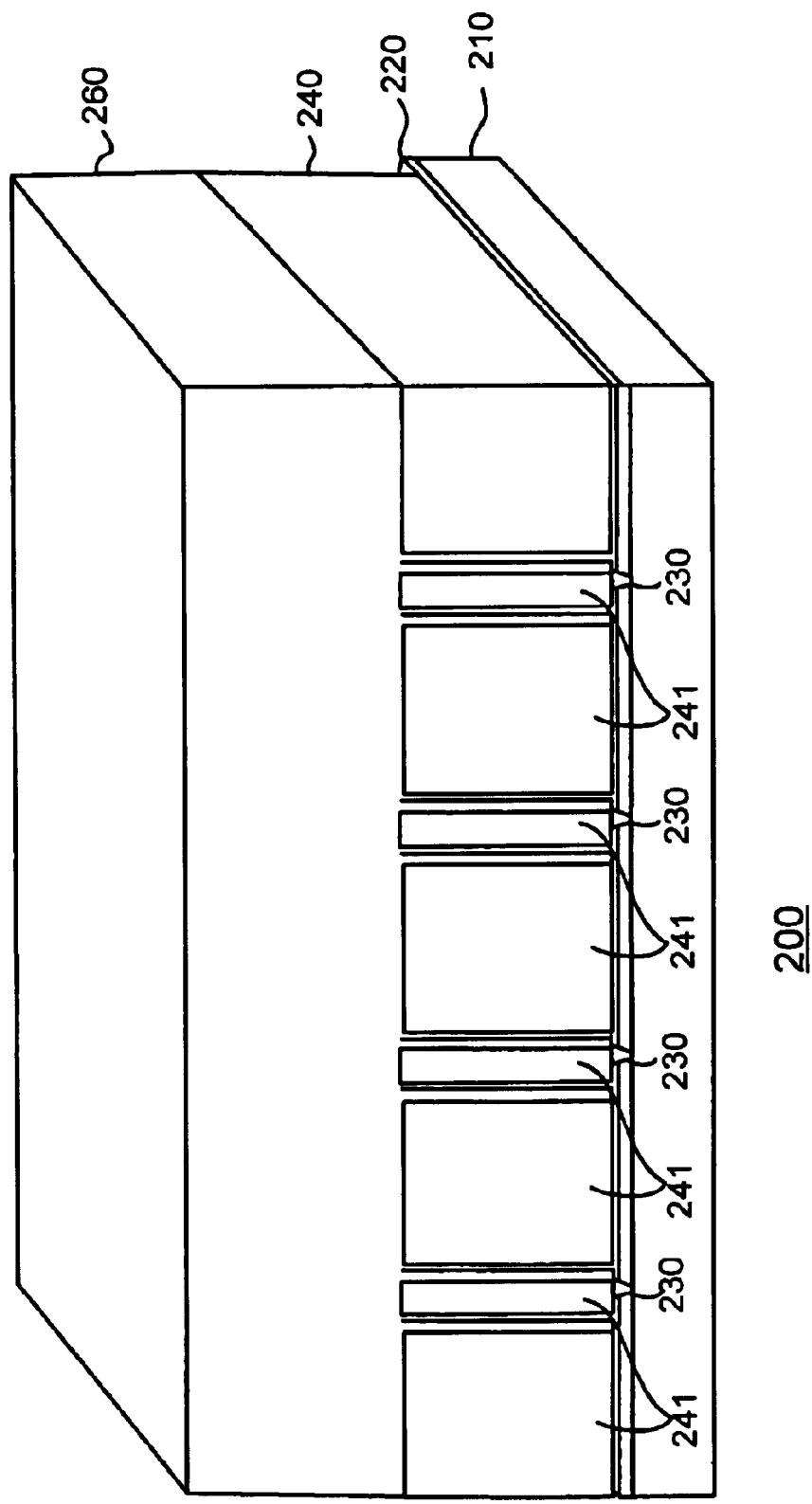

In step 350 of FIG. 9, a layer 260 of second capacitor dielectric may be conformally deposited over the second metal layer 240 as shown in FIG. 7. The capacitor dielectric layer 260 fills the spaces 250 between segments 241. The capacitor dielectric layer 260 may comprise one or more layers of a high dielectric constant material, such as BaTiO3, SiTiO3, or various combinations thereof, deposited, for example, using PVD sputtering. The capacitor dielectric layer 260 may be a relatively thin layer approximately 50 to 500 angstroms, depending upon the capacitance desired and the dielectric material or materials used.

Figure 8:
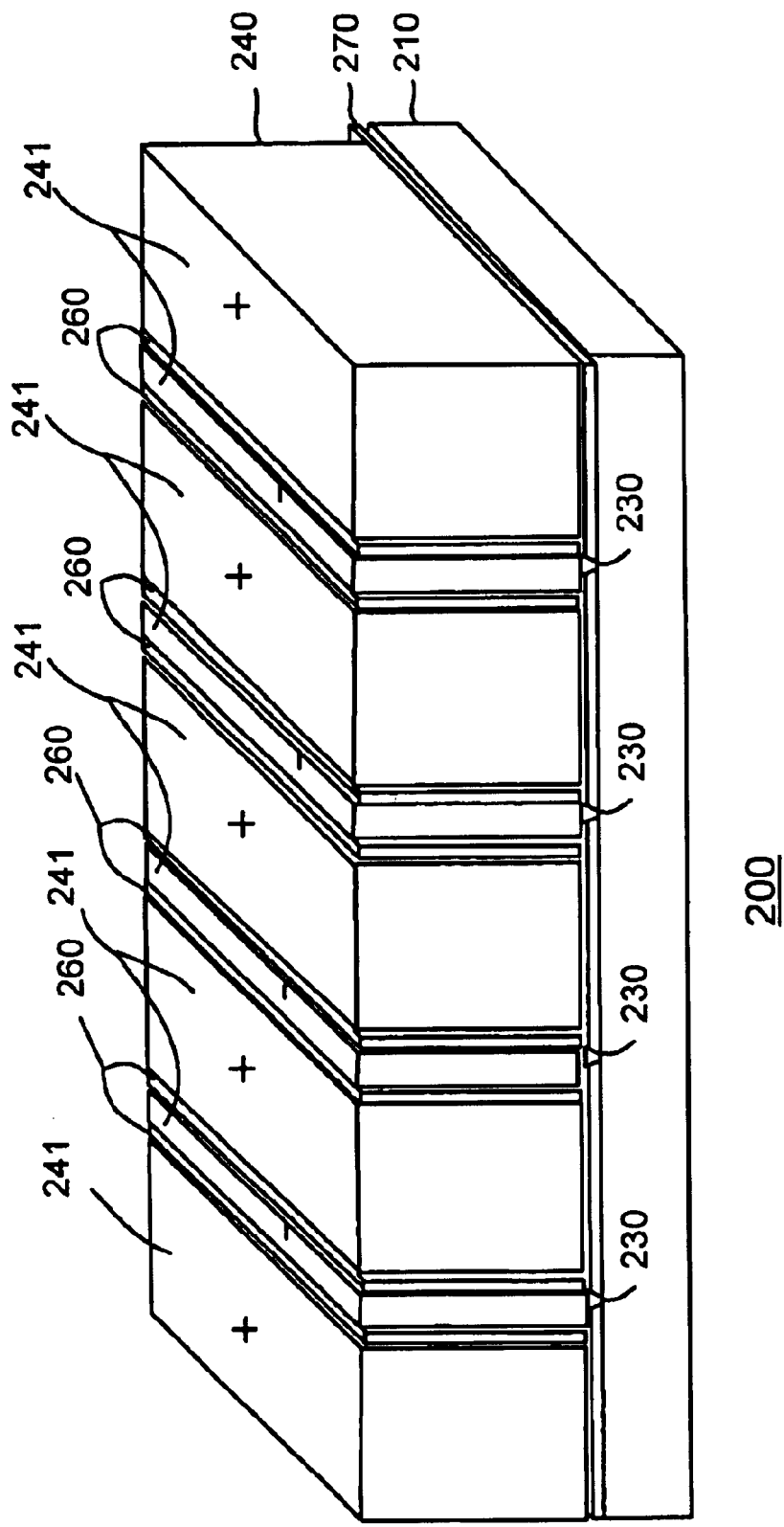

In step 360 of FIG. 9, the capacitor dielectric layer 260 may be etched back to the metal segments 241 of the second metal layer 240 as shown in FIG. 8. Etching may be performed using a conventional etch back process, such as bromide plasma. The metal segments 241 of the second metal layer 240 can be used as an etch stop for the etch back process. The etched capacitor dielectric layer 260 forms the capacitor dielectric 140 disposed between the metal plate segments 131 of the segmented metal plate 130 of the MIM capacitor structure shown in FIGS. 1A and 1B.

While the foregoing invention has been described with reference to the above embodiment, various modifications and changes can be made without departing from the spirit of the invention. Accordingly, all such modifications and changes are considered to be within the scope of the appended claims.

What is claimed is:

1. A capacitor comprising:
   an non-segmented electrically conductive plate;
   an electrically conductive segmented plate defining at least two electrically conductive plate segments disposed over the non-segmented electrically conductive plate;

a first capacitor dielectric disposed between the non-segmented electrically conductive plate and the segmented electrically conductive plate;

at least one electrically conductive interconnect coupling one of the at least two plate segments to the non-segmented electrically conductive plate; and a second capacitor dielectric disposed between the at least two plate segments;

wherein one of the at least two electrically conductive plate segments is thinner than the other one.

2. The capacitor according to claim 1, wherein the thinner plate segment is coupled to the plate by the at least one interconnect.

3. The capacitor according to claim 1, wherein the second capacitor dielectric has a high dielectric constant.

4. The capacitor according to claim 1, wherein the at least two plate segments form a lateral capacitor.

5. The capacitor according to claim 1, wherein the at least one electrically conductive interconnect extends through the first capacitor dielectric.

6. The capacitor according to claim 1, wherein the plate and one of the at least two plate segments are each of a first electrical bias, and the other one of the at least two plate segments is of a second electrical bias opposite to the first electrical bias.

7. The capacitor according to claim 1, wherein the capacitor comprises a metal insulator metal capacitor.

8. A capacitor comprising:

a non segmented electrically conductive plate;

an electrically conductive segmented plate defining a first plurality of electrically conductive plate segments and a second plurality of electrically conductive plate segments, the first and second plurality of electrically conductive plate segments disposed over the non-segmented electrically conductive plate;

a first capacitor dielectric disposed between the non-segmented electrically conductive plate and the segmented electrically conductive plate;

at least one electrically conductive interconnect coupling each of the plate segments of one of the first and second plurality of plate segments to the non-segmented electrically conductive plate; and a second capacitor dielectric disposed between the plate segments;

wherein the plate segments of one of the first and second plurality of electrically conductive plate segments are thinner than the plate segments of the other one.

9. The capacitor according to claim 8, wherein the thinner plate segments are coupled to the non-segmented electrically conductive plate by the at least one interconnects.

10. The capacitor according to claim 8, wherein the second capacitor dielectric has a high dielectric constant.

11. The capacitor according to claim 8, wherein the first and second plurality of plate segments form lateral capacitors.

12. The capacitor according to claim 8, wherein the first plurality of plate segments alternate with the second plurality of plate segments.

13. The capacitor according to claim 8, wherein the at least one electrically conductive interconnects extend through the first capacitor dielectric.

14. The capacitor according to claim 8, wherein the plate and one of the first and second plurality of plate segments are each of a first electrical bias, and the other one of the first and second plurality of plate segments are of a second electrical bias opposite to the first electrical bias.

15. The capacitor according to claim 8, wherein the capacitor comprises a metal insulator metal capacitor.

16. A method of fabricating a capacitor, comprising:

forming a non-segmented electrically conductive plate;

forming a first capacitor dielectric over the non-segmented electrically conductive plate;

forming at least one via in the first capacitor dielectric;

forming an electrically conductive segmented plate over the first capacitor dielectric, the segmented electrically conductive plate defining at least two electrically conductive plate segments, one of the at least two electrically conductive plate segments being thinner than the other one, the at least one via electrically coupling one of the at least two plate segments to the non-segmented electrically conductive plate; and forming a second capacitor dielectric between the at least two plate segments.

17. The method according to claim 16, wherein the capacitor comprises a metal-insulator-metal capacitor.

18. A method of fabricating a capacitor, comprising:

forming a non-segmented electrically conductive plate;

forming a first capacitor dielectric over the non-segmented electrically conductive plate;

forming a plurality of vias in the first capacitor dielectric;

forming an electrically conductive segmented plate over the first capacitor dielectric, the segmented electrically conductive plate defining a first plurality of electrically conductive plate segments and a second plurality of electrically conductive plate segments, the plate segments of one of the first and second plurality of electrically conductive plate segments being thinner than the plate segments of the other one, the vias electrically coupling the conductive plate segments of one of the first and second plurality of plate segments to the non-segmented electrically conductive plate; and forming a second capacitor dielectric between the plate segments.

19. The method according to claim 18, wherein the capacitor comprises a metal-insulator-metal capacitor.

20. A capacitor comprising:

an electrically conductive plate;

an electrically conductive segmented plate defining at least two electrically conductive plate segments disposed over the electrically conductive plate;

a first capacitor dielectric disposed between the electrically conductive plate and the segmented electrically conductive plate;

at least one electrically conductive interconnect coupling one of the at least two plate segments to the electrically conductive plate; and a second capacitor dielectric disposed between the at least two plate segments and extending perpendicular to the first capacitor dielectric, wherein one of the at least two electrically conductive plate segments being thinner than the other one.

* * * * *

UNITED STATES PATENT AND TRADEMARK OFFICE
CERTIFICATE OF CORRECTION

PATENT NO. : 6,934,143 B2 Page 1 of 1
APPLICATION NO. : 10/678236
DATED : August 23, 2005
INVENTOR(S) : You-Hua Chou It is certified that error appears in the above-identified patent and that said Letters Patent is hereby corrected as shown below:

Claim 1, column 4 line 63, delete "an" and insert --a--.

Claim 2, column 5, line 13, after the first occurrence of "the" insert --non segmented electrically conductive--.

Signed and Sealed this

Twelfth Day of September, 2006

JON W. DUDAS
*Director of the United States Patent and Trademark Office*